United States Patent [19]
Imaizumi

[11] 3,959,812
[45] May 25, 1976

[54] HIGH-VOLTAGE SEMICONDUCTOR INTEGRATED CIRCUIT

[75] Inventor: Ichiro Imaizumi, Kodaira, Japan

[73] Assignee: Hitachi, Ltd., Japan

[22] Filed: Feb. 26, 1974

[21] Appl. No.: 445,899

[30] Foreign Application Priority Data
Feb. 26, 1973 Japan................................ 48-22065
Apr. 11, 1973 Japan................................ 48-40432
Aug. 10, 1973 Japan................................ 48-89304

[52] U.S. Cl.................... 357/48; 357/38; 357/47; 357/50; 357/56; 357/59
[51] Int. Cl.² ............. H01L 29/743; H01L 27/04; H01L 29/04; H01L 29/06
[58] Field of Search ................ 357/38, 39, 56, 47, 357/48, 59, 50

[56] References Cited
UNITED STATES PATENTS

| | | | |
|---|---|---|---|
| 3,189,973 | 6/1965 | Edwards et al. | 357/59 |
| 3,391,287 | 7/1968 | Kao et al. | 357/38 |
| 3,391,310 | 7/1968 | Gentry | 357/39 |
| 3,401,320 | 9/1968 | Weinstein | 357/38 |
| 3,404,450 | 10/1968 | Karcher | 357/48 |
| 3,458,781 | 7/1969 | Simon | 357/20 |
| 3,508,127 | 4/1970 | Bergman et al. | 357/38 |
| 3,576,478 | 4/1971 | Watkins | 357/59 |
| 3,600,651 | 8/1971 | Duncan | 357/59 |
| 3,611,067 | 10/1971 | Oberlin et al. | 357/59 |
| 3,615,929 | 10/1971 | Portnoy et al. | 357/56 |
| 3,648,125 | 3/1972 | Peltzer | 357/48 |
| 3,657,612 | 4/1972 | Wiedmann | 357/36 |
| 3,702,790 | 11/1972 | Nakanuma et al. | 357/59 |
| 3,791,882 | 2/1974 | Ogiue | 357/59 |

OTHER PUBLICATIONS

Sack, Def. Pub. of Ser. No. 794,046 filed Jan. 1969, Def. Pub. No. T892,019.

Primary Examiner—William D. Larkins
Attorney, Agent, or Firm—Craig & Antonelli

[57] ABSTRACT

A high-voltage semiconductor integrated circuit consists of an $N^-$-type substrate, a $P^+$-type diffusion layer formed on the surface region of the substrate, an $N^+$-type diffusion layer formed on the $P^+$-type diffusion layer, and an $N^-$-type epitaxial layer formed on the substrate, forming a high voltage-proof transistor against voltage more than one thousand and several hundred volts. Also, an $N^-$ substrate (collector), $N^+$-type diffusion layer, and $N^+$-type diffusion layer, are integrated therewith to form a low-voltage-proof transistor, diode, and PNPN diode in the epitaxial layer so that the entire circuit may take the form of a high voltage-proof power component plus a low voltage-proof control circuit.

6 Claims, 22 Drawing Figures

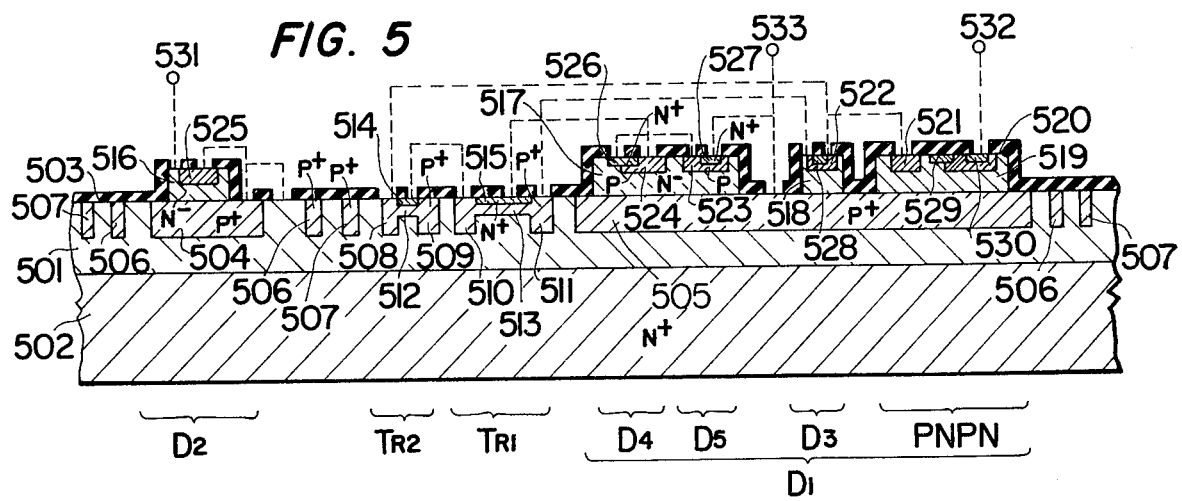
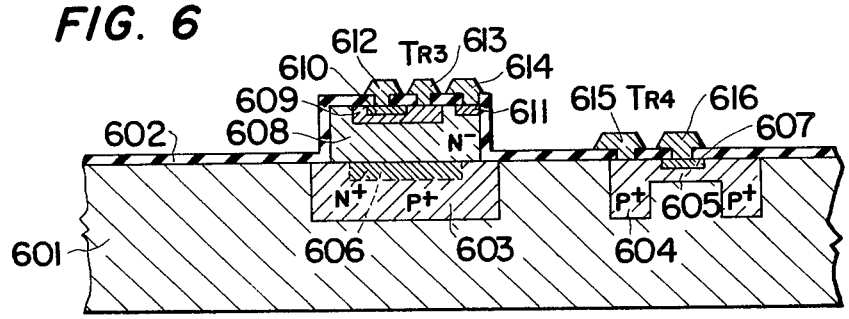
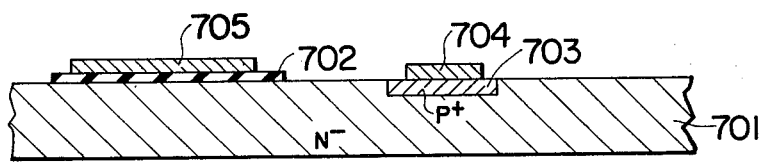
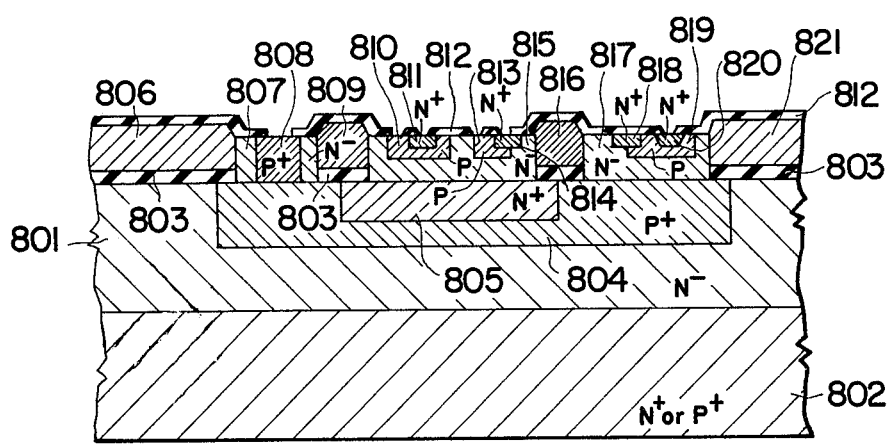

HIGH-VOLTAGE SEMICONDUCTOR INTEGRATED CIRCUIT

BACKGROUND OF THE INVENTION:

The present invention relates to a semiconductor device, particularly to a high-voltage semiconductor device. In more detail, the present invention is intended for a semiconductor integrated circuit containing a high voltage-proof diode, transistor, thyristor, etc.

DESCRIPTION OF THE PRIOR ART:

Heretofore, in semiconductor integrated circuits, isolation has been provided by forming an N-type epitaxial layer on a P-type substrate and then separating portions of the N-type layer from each other by respective P-type diffusion layers. However, problems tend to arise in two areas when a high voltage-proof integrated circuit is realized through this structure.

The first problem area is as follows. The components composing the integrated circuit are formed in the aforesaid N-type epitaxial layer, and the inverse voltage of the PN junction between the P-type diffusion layer and the N-type epitaxial layer of the circuit composing element formed in this case is one hundred and several tens of volts to 200 volts at the highest.

The second problem involves the inverse voltage of the PN junction between the P-type diffusion layer and N-type diffusion layer formed for isolation in the N-type epitaxial layer, ie., isolation voltage protection. Like the first problem, the isolation voltage protection is 200 volts at the highest due to the relationship to the inverse voltage of the epitaxial layer.

The degree of voltage protection is increasing year after year, but a semiconductor device protected against the application of 1,000 volts or more has not yet been produced on an industrial scale.

On the other hand, individual transistors, not utilizing the epitaxial layer, are manufactured at present on a mass-production scale with inverse voltages of one thousand and several hundred volts. This difference is mainly due to the high defect density in the epitaxial layer. Accordingly, an $N^-$-type substrate having an $N^+$-type diffusion layer used in the elemental transistor must be used as the substrate in order to manufacture a high voltage-proof semiconductor device according to the present situation.

The first problem above-mentioned can be solved by employing an $N^-$ substrate having an $N^+$ diffusion layer and treating it with a field limiting ring (reference: High-Voltage Planar PN junction, Y.C. Kao et al., Proceedings of the IEEE, Vol. 55, No. 8 August 1967) and a field plate (reference: Surface Breakdown in Silicon Planar Diodes Equipped with Field plate, F. Conti, Solid-State Electronics, Vol. 15, pp. 93–105, 1972).

A field limiting ring is a P (N)-type region provided on and completely surrounding the outside of P (N)-type regions of the PN junction of a semiconductor, weakening the intensity of electric field on the surface region of the semiconductor to improve the inverse voltage. A field plate is a metallic electrode provided on the upper part of an insulating film formed on the semiconductor formed from the P (N)-type region to the semiconductor surface, so as to increase the inverse voltage by controlling the surface condition of a PN junction. Moreover, one method uses poly-silicon in place of a field plate. Further, another method uses a film of $Al_2O_3$, $Si_3N_4$, etc. or a composite film in combination as an insulating film on the surface, instead of conventional $SiO_2$. Another improved method increases the impurity concentration only on the surface region of a semiconductor by employing ion implantation techniques, etc. so as to increase the inverse voltage of the PN junction.

The above-mentioned methods aim at increasing the inverse voltage of the conventional planar type PN junction to the degree voltage protection determined by the concentration of an intrinsic semiconductor substrate, whereas such an inverse voltage is mainly determined by the surface region.

Through the above-mentioned methods the first problem is solved, that is, the inverse voltage of a PN junction of the circuit composing element is increased. However, the second problem of isolation has not been solved.

That is, as long as each semiconductor element is formed directly on an $N^-$-type substrate having an $N^+$-type diffusion layer, isolation must be provided for that substrate. For this purpose, a P-type diffusion layer extending through the substrate must be provided, but the area necessary for the isolation region of the P-type diffusion layer becomes quite large, losing the advantage as an integrated circuit and reducing it to an impractical device.

SUMMARY OF THE INVENTION

An object of the present invention is to provide a semiconductor device capable of realizing a high voltage semiconductor integrated circuit. In other words, an object of the present invention is to provide a semiconductor integrated circuit device containing a high voltage-proof diode, transistor, thyristor (reverse blocking triode thyrister) etc.

BRIEF DESCRIPTION OF THE INVENTION:

The high voltage-proof semiconductor device according to the present device is a semiconductor device provided with at least one diffusion layer, different in conductivity type from a substrate, on the surface region of the substrate of a negative conductivity type and at least one epitaxial layer of the same conductivity type as the aforesaid substrate formed on the said diffusion layer. In particular, the diffusion layer provided on the surface region of the substrate constitutes a part or substantially all of the area of a high voltage-proof diode, transistor, and thyristor, and a satisfactorily low voltage-proof semiconductor element is integrated in the epitaxial layer.

The high voltage-proof semiconductor device of the present invention is a semiconductor device characterized by forming a new semiconductor region on the surface of the semiconductor substrate having active elements such as a transistor, a diode, and a thyristor formed thereon, for example, forming an epitaxially grown layer, thereby forming circuit elements such as a resistance, a transistor, and a diode in the semiconductor region.

According to a modification of the high voltage-proof semiconductor device of the present invention, there is provided a semiconductor device having a semiconductor substrate of negative conductivity type, at least one frame region of reverse conductivity type provided on the surface region of the substrate, and at least having one substrate provided on the substrate surface region surrounded by the frame region and an epitaxial layer of the same conductivity type, particularly provided with a region of reverse conductivity type connected through the epitaxial layer to the frame region. In this high voltage-proof semiconductor device, the aforesaid region of reverse conductivity type connected through the epitaxial layer to the frame region of the substrate surface region forms a PN junction against the substrate, constituting part of a circuit composing elements requiring a high degree of voltage protection.

DESCRIPTION OF THE DRAWING

FIG. 5 is a cross-sectional view of a high voltage-proof semiconductor integrated circuit when the present invention is applied to the circuit shown in FIG. 4, indicating an embodiment of the high voltage-proof semiconductor integrated circuit of the present invention;

FIG. 6 is a cross-sectional view of a high voltage-proof semiconductor integrated circuit of the present invention, provided with an $N^+$-type embedded layer;

FIG. 7 is a cross-sectional view of a part of a high voltage-proof semiconductor integrated circuit of the present invention in consideration of the role of poly-silicon layer as conductor resistance;

FIG. 8 is a cross-sectional view of a high voltage-proof semiconductor integrated circuit of the present invention provided with isolation of a poly-silicon layer;

DETAILED DESCRIPTION OF THE INVENTION:

The principle of the present invention will be described in comparison with the conventional technique in the following.

Figure 1:
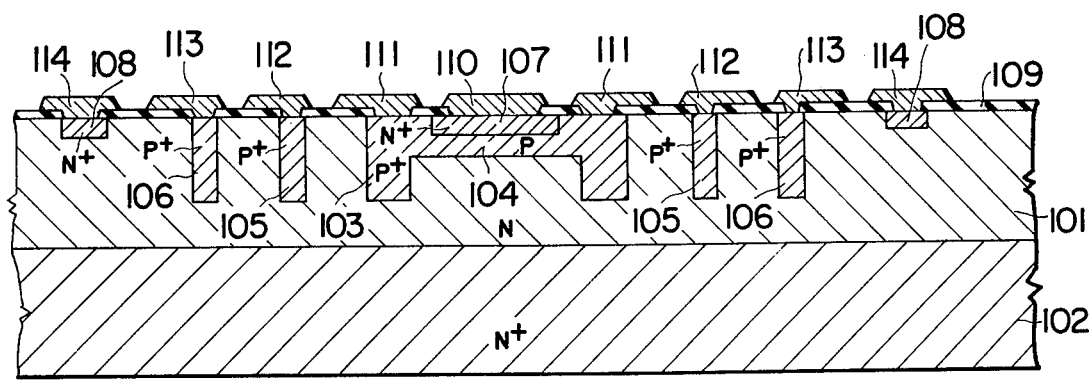
FIG. 1 is a cross-sectional view of a conventional high voltage-proof planar transistor element.

FIG. 1 is a longitudinal cross-sectional view of a high voltage-proof elemental transistor formed on an $N^-$ substrate having an $N^+$ diffusion layer. The high voltage-proof transistor shown in FIG. 1 has a planar type transistor; a field limiting ring, a field plate, and the like are used for increasing the inverse voltage of a planar type PN junction.

Referring to FIG. 1, reference numeral 101 indicates an $N^-$-type semiconductor substrate, 102 an $N^+$-type highly concentrated diffusion layer for decreasing the series parasitic resistance of the collector, 103 a $P^+$-type highly concentrated diffusion layer for decreasing the parasitic resistance of the base, 104 a base diffusion layer (P-type), $P^+$-type diffusion layers 105 and 106 are field limiting rings formed simultaneously with $P^+$-type diffusion 103; numeral 107 indicates an emitter diffusion layer ($N^+$-type), 108 and $N^+$-type diffusion layer acting as a channel stopper formed simulatneously with the $N^+$-type diffusion layer 107, 109, an insulating film formed on the semiconductor surface, 110 and emitter electrode, 111 a base electrode and field plate, 112 and 113 field plates, and 114 an electrode equal in potential to the potential of the collector. The collector electrode is taken out from the lower surface of the diffusion surface 102. As can be seen from FIG. 1, a transistor element does not require a complicated etching process, but may be simply formed with a diamond cutter. However, composing the integrated circuit in this construction is difficult in the following respects.

1. In the structure shown in FIG. 1, having an $N^+$ diffusion layer for a conventional low voltage-proof IC, the substrate is P-type and an $N^-$-type epitaxial layer is used, and a PN junction is formed in the epitaxial layer to form a transistor and the like; the degree of voltage protection of the collector-base junction is 200 volts, at the most, because of defects in the epitaxial layer.

2. Consequently, the voltage protection of the isolation of the PN junction formed in the above-mentioned epitaxial layer becomes lower than 200 volts.

3. If, as shown in FIG. 2, an $N^-$-type substrate 201 is used, an $N^+$ diffusion layer 202 is diffused, using a mask, to form $P^+$ isolation regions 216, 215, by treating both faces of the wafer, and voltage protection for both the isolation and transistor is attained; however, the area necessary becomes quite large and so that the device is not practically feasible.

Figure 2:
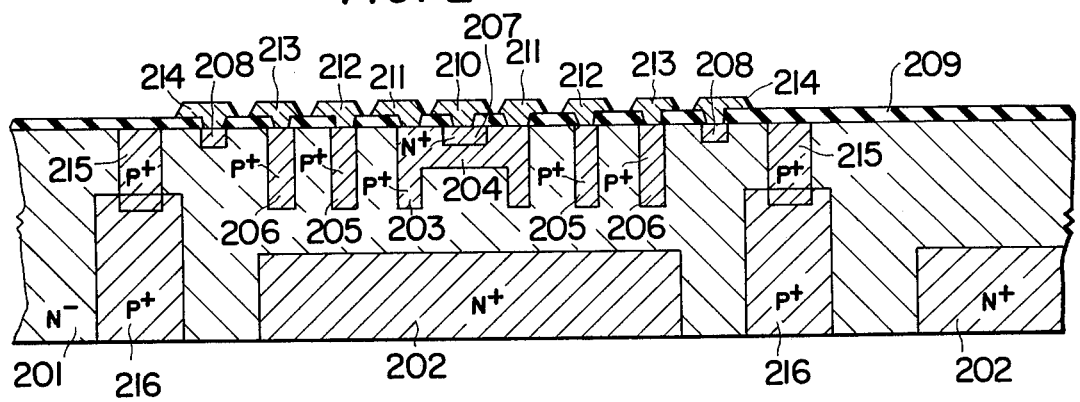
FIG. 2 is a cross-sectional view of a high voltage proof transistor with isolation regions extending through the semiconductor crystal substrate.

In FIG. 2, numeral 215 indicates a $P^+$ diffusion layer for isolation formed simultaneously with a $P^+$ type diffusion layer 203 and 216 is a diffusion layer for $P^+$ isolation diffused on the other side of the wafer using a mask. Further, in FIG. 2, numerals 205 and 206 are field limiting rings formed simultaneously with $P^+$ type diffusion layer 203, 207 an emitter diffusion layer ($N^+$ type), 208 and $N^+$ type diffusion layer formed simultaneously with $N^+$ type diffusion layer 207, 209 an insulating film formed on the semiconductor surface, 210 an emitter electrode, 211 a base electrode and field plate, 212 and 213 field plates, and 214 an electrode for applying the collector potential. In FIG. 2 the collector electrode is taken out from the $N^+$ diffusion layer 202 behind the wafer.

As is described above, in this embodiment, for forming a high voltage-proof PN junction, (1) an epitaxial layer may not be used, (2) a field limiting ring is provided, and (3) a surface treatment must be effected with the aid of a field plate, etc. From these restrictions, a high voltage-proof IC naturally has the construction as shown in FIG. 2. However, PN junction isolation passing through the substrate cannot be used, as is seen from FIG. 2.

On the other hand, an integrated circuit requiring high voltage protection is mainly a linear integrated circuit; moreover, transistors and other elements requiring high voltage protection are, in most cases, limited to one or two in number. That is, a high voltage-protected power IC is generally composed of a high voltage-protected transistor in the final step, and a relatively low voltage protected element, for controlling the transistor, in the preceding step. In extreme, but relatively numerous circuits, the circuits are composed of a high voltage-proof transistor plus a control circuit. Accordingly, the high voltage-proof PN junction has two portions: an actually operating portion (in the case of a transistor, the collector-base junction) and an isolation portion.

Accordingly, in a high voltage-proof semiconductor device, according to the present invention, a PN junction is formed directly on the semiconductor crystal substrate, thereby forming a high voltage proof transistor and another high voltage-proof transistor and a diode capable of utilizing the same region as the collector region of the high voltage-proof transistor with the aid of the PN junction having a large inverse voltage, and further a semiconductor region, such as an epitaxially grown layer, is formed in the surface region of the crystal substrate, forming therein a low voltage-proof semiconductor element (such as a transistor and a diode) satisfactorily protected against one hundred and tens of volts, thus composing an integrated circuit.

The semiconductor circuit thus formed provides all the PN junction parts requiring high voltage protection on the semiconductor substrate crystal and the circuit composing elements satisfactorily protected against low voltage on the epitaxial layer formed on the substrate, thus realizing a high voltage-proof semiconductor integrated circuit, as a whole, in the form of a monolithic IC, instead of a hybrid IC.

The high voltage-proof semiconductor integrated circuit according to the present invention will be explained in the order of manufacturing steps referring to FIGS. 3a–3e.

Figure 3A:
FIGS. 3a–3e are schematic drawings for explaining the principle of a high voltage-proof semiconductor integrated circuit device according to the present invention.

On the surface of a semiconductor substrate 301 such as Si, there is formed a film 302 serving as a mask (for example, an oxide film such as $SiO_2$ and alumina). As the semiconductor substrate, $N^-$ type material alone may be used, or it may have $N^+$-$N^-$ type construction shown in FIG. 2. The film 302 formed on the substrate surface is partially removed by a photo resist process, used conventionally. The cross-section of the substrate and film 302 is shown in FIG. 3a.

Figure 3B:
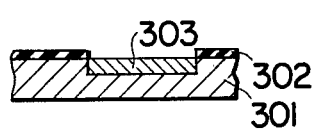
Figure 3C:

Subsequently, a P type layer 303 is formed by thermal diffusion, as shown in FIG. 3b. This P-type diffusion layer 303 is a diffusion layer for forming part of the base region of a conventional planar type high voltage proof transistor, guard ring. The oxide film 302 is removed thereafter. The state when all the oxide film is removed is shown in FIG. 3c. The process for removing part of the oxide film 302 will be described hereinafter.

Figure 3D:
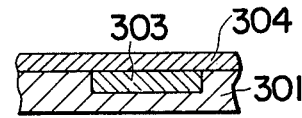

An $N^-$ type layer 304 is formed on the substrate surface by epitaxial growth. This condition is shown in FIG. 3d. The epitaxial layer 304 is partly etched by the photo resist process. As a requirement in this case, at least a part of the epitaxial layer 304 remains on the diffusion layer 303. This is shown in FIG. 3e.

Now, the voltage protection between the substrate 301 and the epitaxial layer 304 will be explained with reference to FIG. 3e. First, assume that a high voltage (of about 1,000 volts) is applied between the substrate 301 and the diffusion layer 303. The PN junction between the diffusion layer 303 and substrate 301 can sufficiently withstand a voltage over 1,000 volts as long as provision such as the aforesaid field limiting ring is provided. Then, the voltage protection between the diffusion layer 303 and the epitaxial layer 304 is on the order of 200 volts, as described above. It accordingly follows that the epitaxial layer 304 substantially has isolation voltage protection against a voltage of over 1,000 volts applied to the substrate 301.

Figure 3E:
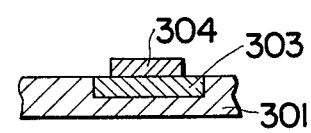

In the present invention, as shown in FIG. 3e, only the substrate 301 and the diffusion layer 303 thereon possess high inverse voltage protection and, therefore, the layer to which a voltage over 1,000 volts can be applied is restricted to the substrate 1 alone. It is, however, possible to integrate a considerably complicated circuit even if there is such a restriction. Moreover, the integrated circuit requiring high voltage protection is a linear integrated circuit and, further, a transistor demanding high voltage protection is limited to one or two in number in most cases, as mentioned previously. Consequently, a circuit having a high voltage-proof transistor and another high voltage proof transistor and diode capable of utilizing the same collector region as the transistor, and also possessing an element which can satisfactorily withstand one hundred and several tens of volts can provide a high voltage proof integrated circuit by the formation of an epitaxial layer.

In the following, the present invention will be explained in more detail referring to various embodiments.

EMBODIMENT 1

Figure 4:
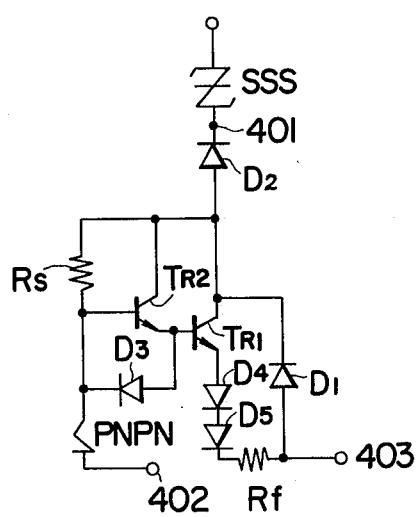
FIG. 4 is a drawing indicating a semiconductor integrated circuit containing circuit composing elements requiring a high degree of voltage protection.

The first embodiment of the present invention will be explained referring to FIGS. 4 and 5. The cross-sectional construction of a high voltage-proof semiconductor integrated circuit, in which the present invention is applied to a circuit shown in FIG. 4, is shown in FIG. 5. In FIGS. 4 and 5, a diode $D_1$ and transistors $Tr_1$, $Tr_2$ are circuit composing elements requiring high voltage protection.

In FIG. 5, the SSS diode SSS and resistances Rb and Rf of the circuit shown in FIG. 4 are not included; however, it is readily possible, according to conventional techniques employed in semiconductor circuits, to provide such elements in the semiconductor integrated circuit shown in FIG. 5.

In FIG. 5, numeral 501 denotes an $N^-$ type silicon substrate, 502 and $N^+$ diffusion layer provided in the $N^-$ type substrate, 503 silicon oxide film, 504 through 511 are deep P type diffusion layers of high concentration provided in the $N^-$ type substrate, 506 and 507 are field limiting rings, 508 through 511 serving as P type high concentration diffusion layer for reducing parasitic resistance of bases of transistors $Tr_1$ an $Tr_2$. Numerals 512 and 513 indicate base diffusion layers (P type) of transistors $Tr_1$ and $Tr_2$, 514 and 515 emitter diffusion layers ($N^+$ type) of transistors $Tr_1$ and $Tr_2$. Further, in FIG. 5, 516 through 519 denote $N^-$ type epitaxial layers (silicon single crystal layers) provided insularly on the $P^+$ type diffusion layer of $N^-$ type substrate, and on each insular epitaxial layer are provided P type diffusion layers 520 through 525 and N⁺ type diffusion layers 526 through 530. The P type diffusion layers 520–525 may be provided simultaneously with the P type diffusion layers 512, 513. Also, N⁺ type diffusion layers 526–530 may be provided simultaneously with the P type diffusion layers 514, 515.

Each element of the circuit shown in FIG. 4 corresponds to the semiconductor integrated circuit shown in FIG. 5 as follows: The diode $D_1$ consists of N⁻ – N⁺ substrate 501 (cathode) and P⁺ type diffusion layer 505 (anode). The diode $D_2$ consists of N⁻ type epitaxial layer 516 (cathode) and P⁺ type diffusion layers 504, 525 (anode). The diode $D_3$ consists of P type diffusion layer 522 (anode) and N⁺ type diffusion layer 528 (cathode). The diode $D_4$ consists of P type diffusion layer 524 (anode) and N⁺ type diffusion layer 526 (cathode). The diode $D_5$ consists of P type diffusion layer 523 (anode) and N⁺ type diffusion layer 527 (cathode). The transistor $Tr_1$ consists of N⁻ - N⁺ substrate 501 (substrate), P type diffusion layer 513 (base), P⁺ type diffusion layers 510, 511 (base: a base region of high impurity concentration for reducing the base parasitic resistance), and N⁺ type diffusion layer 515 (emitter). The transistor $Tr_2$ consists of N⁻ - N⁺ substrate 501 (collector), P type diffusion layer 512 (base), P⁺ type diffusion layers 508, 509 (base: high impurity concentration for reducing the base parasitic resistance), and N⁺ type diffusion layer 514 (emitter). The PNPN diode indicated by PNPN consists of P type diffusion layer 521, N⁻ type epitaxial layer 519, N⁺ type diffusion layer 529, P type diffusion layer 520, and N⁺ type diffusion layer 530.

Incidentally, in the semiconductor integrated circuit in FIG. 5, electrodes and wiring conductors are omitted for convenience, but, of course, it is easy to provide such elements according to conventional techniques. The connection relationship of the circuit elements of the high voltage-proof integrated circuit in FIG. 5 is shown by the broken lines in the figure. The terminals 531, 532, and 533 in FIG. 5 correspond, respectively, to the terminals 401, 402, and 403 in FIG. 4.

In the semiconductor integrated circuit shown in FIG. 5, the specific resistance of N⁻ type substrate 501 is 30–70 Ω-cm, N⁺ type diffusion layer 502 is about 100μ thick, N⁻ layer is about 140μ thick and P⁺ type diffusion layer is about 20–30μ deep. The semiconductor integrated circuit thus formed has an inverse voltage of over 1200 volts in the PN junction between N⁻ type substrate 501 and P⁺ type diffusion layers 504–511 and the PN junction between the N⁻ type substrate 501 and P type diffusion layers 512, 513. As a consequence, the semiconductor integrated circuit of FIG. 5 becomes a high voltage-proof semiconductor integrated circuit having a diode $D_1$, transistors $Tr_1$ and $Tr_2$ protected against a voltage above 1000 volts.

On the other hand, in case the voltage protection between the deep P⁺ type diffusion layer and N⁻ type epitaxial layer is not very essential, an N⁺ type diffusion layer 606 is formed inside the P⁺ type diffusion layer 606 and then an N⁻ type epitaxial layer 608 is formed, as shown in FIG. 6, thereby obtaining a transistor $Tr_3$ having small collector series resistance.

In FIG. 6, 601 indicates an N⁻ type substrate (such as silicon) which forms a diode (or isolation region) together with P⁺ type diffusion layer 603. A transistor $Tr_3$ is composed of an insular N⁻ type epitaxial layer 608 (collector), P-type diffusion layer 609 (base), and N⁺ type diffusion layer 610 (emitter). N⁺ region 606 is disposed beneath collector layer 608. A transistor $Tr_4$ is composed of the substrate 601, P type diffusion layer 605 (base), P⁺ type diffusion layer 604 (the base region of high impurity concentration for reducing the base parasitic resistance), and N⁺ type diffusion layer 607 (emitter). Numeral 611 denotes an N⁺ type diffusion layer for collector contact, 612–616 electrodes, and 602 an insulating film (silicon oxide film, etc.)

If a film partially remains in the process of FIG. 3c, poly crystalline silicon grows on the film, yielding a semiconductor device shown in FIG. 7. In FIG. 7, the numeral 701 indicates N⁻ type silicon substrate, 703 a P⁺ type diffusion layer, 704 an N⁻ type silicon single crystal layer (epitaxial layer), 702 a silicon oxide film ($SiO_2$), and 705 a poly-crystalline silicon layer. This poly-crystalline silicon layer 705 is usable as a conductor or resistance when an impurity is diffused in a subsequent process.

As can be seen from the above embodiment, according to the present invention, a high voltage-proof semiconductor device hitherto unobtainable is easily obtained, using a substrate of a conventional elemental transistor in the same diffusion process, by merely adding the formation of N⁻ type epitaxial layer and by effecting selective etching.

In the above embodiment, as shown in FIG. 3e, the epitaxially grown layer formed on the semiconductor crystal substrate is etched to be divided into several insular regions, and the integrating circuit composing elements are protected against low voltage in insular regions. The epitaxial layer is divided into insular regions, so as to serve as insulation. However, the epitaxial layer mentioned above can, of course, produce a high voltage proof semiconductor integrated circuit of the present invention, even if it is not divided into insular regions. For example, in the condition shown in FIG. 3b, if epitaxial growth is effected on the substrate, epitaxial growth of single crystal semiconductor takes place on the exposed portion of the substrate surface, that is, on the substrate of the portion forming a PN junction of a high inverse voltage and, simultaneously, a polycrystalline semiconductor layer is formed on the insulating film (such as $SiO_2$) covering the substrate surface. As a consequence, the insular region of the epitaxial layer (single crystal semiconductor) divided by the polycrystalline semiconductor (exhibiting an insulating property) is formed on high voltage proof circuit composing elements, producing substantially the same construction as the result of FIG. 3e. By utilizing such an effect, a high voltage proof semiconductor integrated circuit of the present invention can be obtained.

EMBODIMENT 2

Another embodiment of the present invention is shown in FIG. 8. The semiconductor device shown in FIG. 8 will be explained according to the order of the steps of manufacture. On the surface of a silicon semiconductor substrate 801 there is formed a film 803 acting as a mask (for example, an oxide film, such as $SiO_2$ and alumina) when thermally diffused. It is noted herein that the silcon semiconductor substrate 801 may be either of N⁺ - N⁻ type construction having N⁺ type diffusion layer 802 shown in FIG. 5 or N⁻ type construction shown in FIG. 3. The film formed on the substrate surface is partly removed by a conventional photo resist process. Thereafter, a P⁺ type diffusion layer 804 is formed by thermal diffusion. This P⁺ type diffusion layer is used as a base region of a conventional planar type high voltage-proof transistor. Subsequently, a film (such as an oxide film of silicon) acting as a mask for emitting diffusion is formed on the substrate and an emitter diffusion window is formed by a conventional photo resist technique, and an N⁺ type diffusion layer 805 is formed, thus providing an emitter region. In this manner, a semiconductor device of the same construction as the conventional elemental high voltage-proof transistor is formed. Moreover, the $h_{FE}$ of the transistor is set at a small value relative to the final end value considering the heat treatment in the subsequent process.

Thereafter, on the mask oxide film (such as an oxide film of silicon) used in the above diffusion process and silicon oxide film formed during the diffusion process, a window portion is formed for contact by photoetching. An epitaxially grown layer (single crystal silicon layer) of N⁻ type silicon layer is formed on the substrate. Epitaxially grown layers (silicon single crystal layer) 807, 815 and 817 grow epitaxially on the exposed part of semiconductor crystal substrate, and poly-silicon (i.e. polycrystalline silicon) layers 806, 809, 816, and 812 grow on the insulator film 803. These poly-silicon layers grow into layers of very high specific resistance to isolate the emitter 805 from the silicon single crystal 815 grown on the diffusion layer 804 by high resistance. The poly-silicon layers 806, 821 on the collector layer 801 may be operated as a field plate depending on the applied voltage. This epitaxial layer grows as thick as 2–3$\mu$ in about 15 minutes at 1100°C, hardly affecting the emitter diffusion in the substrate.

Then a P⁺ diffusion layer 808 is provided for taking out the base electrode and, further P type diffusion layers 801, 813, 819 and N⁺ type diffusion layers 811, 814, 818 and 820 are formed for forming the diode, transistor PNPN diode elements, etc. The depth of these diffusions is 1–2$\mu$, at most, and sufficiently small as compared with the ten $\mu$ depth of the emitter N⁺ diffusion layer in the substrate.

In FIG. 8, numeral 812 indicates a silicon oxide film provided with a window portion for an electrode. It is herein noted that the electrode and wiring conductor omitted in FIG. 8 may be formed according to conventional techniques.

Figure 9:
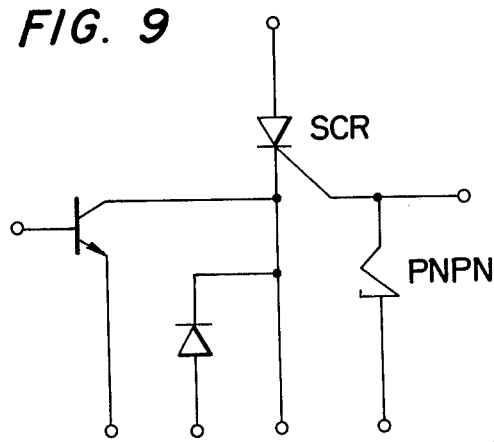
FIG. 9 is a circuit diagram of the high voltage-proof semiconductor integrated circuit shown in FIG. 8.

The circuit shown in FIG. 8 is such that the substrate portion becomes a thyristor (P⁺ type layer 802-N⁻ substrate 801 - P⁺ diffusion layer 804 - N⁻ type diffusion layer 805) if the layer 802 is made P⁺ type, composing a circuit shown in FIG. 9. In such a manner, a high voltage-proof semiconductor integrated circuit having a transistor or thyristor protected against a voltage above 1200 volts by using a substrate of a specific resistance 100–50 Ω-cm as silicon substrate is obtained.

EMBODIMENT 3

Figure 10:
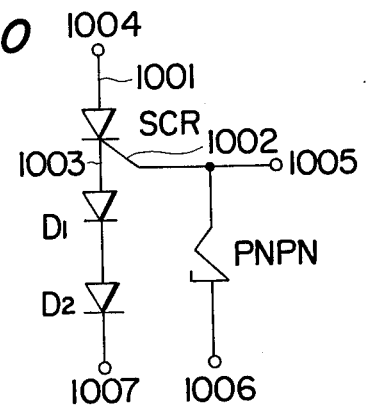
FIG. 10 is a fragmentary drawing of a lighting circuit of a discharge lamp.

In the method of forming the present invention, an integrated circuit can be provided for the lighting circuit of a discharge lamp. A part of this discharge lamp lighting circuit is shown in FIG. 10. A semiconductor integrated circuit applying the present invention to the circuit of FIG. 10 is shown in FIG. 11.

Figure 11:
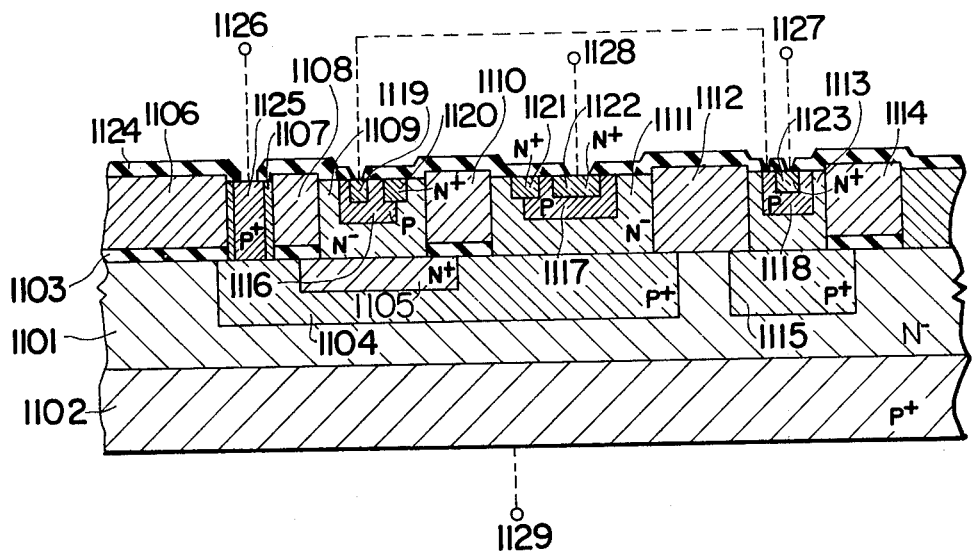
FIG. 11 is a cross-sectional view of a device constituting the discharge lamp lighting circuit shown in FIG. 10 with a high voltage-proof semiconductor integrated circuit of the present invention.

In FIG. 11, numeral 1101 is an N⁻ type silicon substrate. P⁺ type diffusion layer 1102 (1001 in FIG. 10), N⁻ type substrate 1101, P⁺ type diffusion layer 1104 (1002 in FIG. 10), and N⁺ type diffusion layer 1105 (1003 in FIG. 10) form a high voltage proof thyristor. The PNPN diode in FIG. 10 is composed, in FIG. 11, of P⁺ type diffusion layer 1104, N⁻ type epitaxial layer 111, P type diffusion layer 1117, and an N⁺ type diffusion layer 1122. The diode $D_1$ is composed of P type diffusion layer 1116 and N⁺ type diffusion layer 1119. The diode $D_2$ is composed of P type diffusion layer 1118 and N⁺ type diffusion layer 1123. In FIG. 11, numerals 1106, 1108, 1110, 1112 and 1114 denote poly-silicon layers formed on silicon oxide film 1103; 1107, 1109, 1111, and 1113 epitaxially grown layers (single crystal silicon layer); 1124 a silicon oxide film; 1120 and 1121 N⁺ type diffusion layers; and 1115 and 1125 P⁺ type diffusion layers. The metallic electrode and wiring conductor are omitted in FIG. 11, but the wiring connecting each element is shown in broken lines. In FIG. 11, the terminal 1126 corresponds to the terminal 1005 of FIG. 10, the terminal 1127 to the terminal 1007, the terminal 1128 to the terminal 1006, and the terminal 1129 to the terminal 1004.

In such a manner, a high voltage-proof semiconductor integrated circuit having a thyristor protected against voltages over 1200V is obtained, using an N⁻ type silicon substrate of, specific resistance 100–50 Ωcm.

EMBODIMENT 4

In connection with FIG. 8, description was given of a case in which elements are composed on the upper portion of a transistor. However, if this cross-sectional construction is formed in the other portion, as shown in FIG. 12, and the lowest potential of the circuit is applied to the P⁺ diffusion layer 1204, then it becomes possible to freely compose the same IC as the conventional low electric potential IC in the epitaxial layer 1211 thereon.

Figure 12:
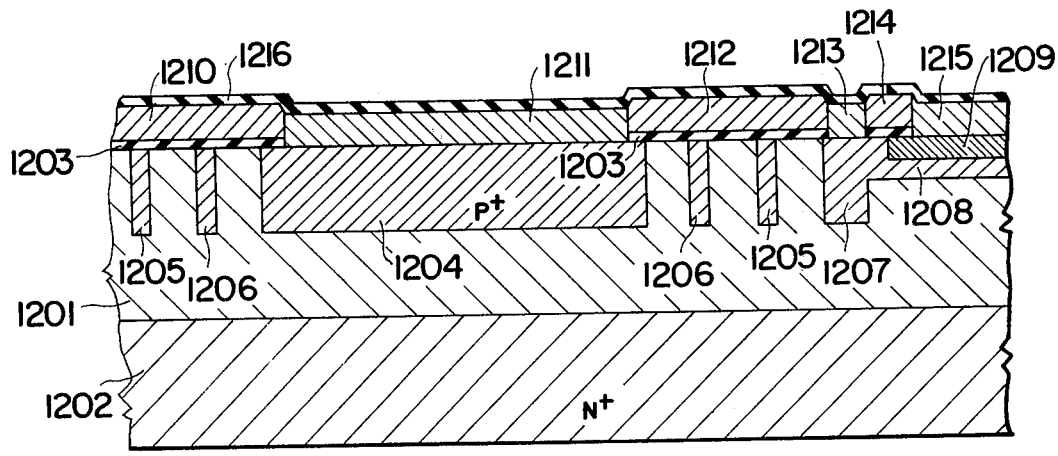
FIG. 12 is a cross-sectional view of a part of a semiconductor integrated circuit of the present invention, containing a plurality of circuit composing elements requiring a high degree of voltage protection.

In FIG. 12, numeral 1201 indicates N⁻ type silicon substrate, 1202 N⁺ type diffusion layer, 1203 silicon oxide film, 1204 P⁺ type diffusion layer, 1205 and 1206 field limiting ring comprising P⁺ type diffusion layer, 1207 P⁺ type diffusion layer for reducing the parasitic base resistance of a transistor, 1208 the base diffusion layer (P type) of a transistor, 1209 the emitter diffusion layer (N⁺ type); 1210, 1212, and 1214 denote poly-silicon formed on a silicon oxide film 1203; 1211, 1213 and 1215 epitaxially grown layers (single crystal silicon layer); and 1216 a silicon oxide film.

By the above arrangement, a high voltage - proof semiconductor integrated circuit is obtained which has a transistor, diode and SCR protected against voltages exceeding one thousand and several hundred volts.

Moreover, it is obvious that the present invention is effective not only for a transistor and an SCR having a P⁺ diffusion layer effecting mask diffusion, as in FIG. 8, but also for a conventional transistor and an SCR having a P⁺ diffusion layer effecting diffusion without using a mask over the entirety of the wafer.

As is evident from the above embodiment, an IC containing a transistor protected against voltages exceeding 1000 V can be composed in the form of monolithic IC instead of hybrid IC, by composing an IC of high voltage proof element and a low voltage proof control circuit in the same chip area of the high voltage-proof power element.

In the above embodiment, the circuit composing elements requiring high voltage protection are all formed in the surface region of the crystal substrate and the low voltage proof elements are formed in the epitaxially grown layer provided on the substrate. However, both the circuit composing element requiring high voltage protection and the high voltage withstanding semiconductor integrated circuit device formed on the aforesaid epitaxially grown layer may be provided in accordance with the present invention.

That is, on the surface region of a semiconductor substrate of negative conductivity type there is formed at least one framed region of a conductivity type different from that of the said substrate, and an epitaxially grown layer of the same conductivity as that of said substrate is formed on the substrate surface surrounding at least said framed region, which passes through the epitaxial layer from the surface region of said epitaxial layer to form a PN junction with the crystal substrate thereunder and further forming a region of the same conductivity type (conductivity type reverse to the substrate) as the framed region, connected to the framed region. In such a manner, the region forming the PN junction even with the semiconductor crystal substrate passing through the epitaxially grown layer is used as a part or as all of the circuit composing element, thereby making it possible to provide a high voltage withstanding semiconductor integrated circuit similar to those previously described.

In other words, a high voltage withstanding semiconductor device in accordance with the present invention, has a semiconductor crystal substrate, an epitaxially grown layer provided on the substrate and a region passing through the epitaxially grown layer to form a PN junction with the substrate and of an opposite conductivity type to that of the substrate, employing the reverse conductivity type region as a part of the circuit composing element requiring a high breakdown voltage.

EMBODIMENT 5

The high breakdown voltage semiconductor integrated circuit of the present invention will be explained referring to FIGS. 13a, 13b, 13c, 13d and 13e in the order of the manufacturing steps.

Figure 13A:
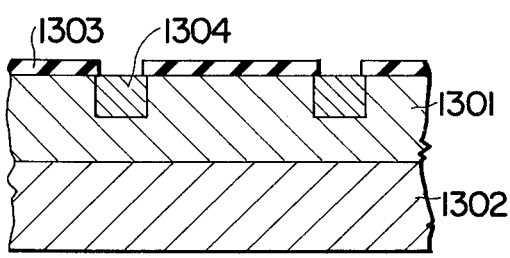
FIGS. 13a–13e are drawings for explaining the manufacturing process of a high voltage-proof semiconductor integrated circuit of the present invention, formed of an epitaxial layer provided on a semiconductor crystal substrate and circuit composing elements spanning the substrate and requiring a high degree of voltage protection.

On the surface of an N$^-$ type silicon substrate 1301 is formed a film 1303 (for example, a film of SiO$_2$, alumina, etc.) acting as a mask against thermal diffusion. It is herein noted that the semiconductor substrate 1301 may have two regions as shown in the figure or only one substrate 1301. The region 1302 is generally a high impurity concentration diffused layer, and may be either of the same conductivity type (N$^+$ type) as the substrate or of different conductivity type (P$^+$ type). A film 1303 formed on the substrate surface is partly removed by photo resist techniques to form a diffusion mask, forming a P$^+$ type diffusion mask 1304 in the form of a frame. The cross-sectional contour after completing this process is shown in FIG. 13a.

Figure 13B:
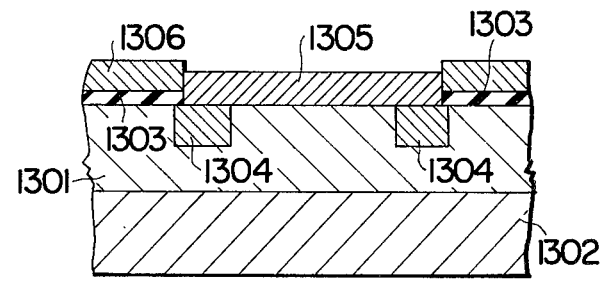

Subsequently, after removing the oxide film of the region surrounded by the framed P$^+$ diffusion layer 1304, an epitaxial layer 1305 is grown by a conventional decomposition reaction of monosilane. At this time, a poly-silicon layer 1306 is formed on the upper portion of the oxide film 1303 and single crystal silicon layer 1305 is formed on the exposed surface of the silicon substrate. The conductivity type of the epitaxial 1305 is the same N$^-$ type as the substrate 1. This structure is shown in FIG. 13b. The diffusion layer 1304 is part of the base region of a transistor of the present invention and a guard ring may be formed simultaneously therewith.

Figure 13C:
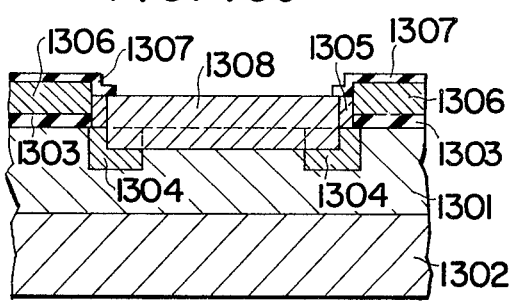

The epitaxial layer (single crystal silicon) 1305 and poly-silicon layer 1306 are thereafter oxidized on the surface, or an insulating film 1307 is formed thereon with the aid of CVD (chemical vapor deposition) and then partly etched by a photo resist process, forming a P$^+$ diffusion layer of the same conductivity type as the aforesaid diffusion layer 1304, using this film as a mask. The diffusion layer 1308 passes through the epitaxial layer 1305 to reach the substrate 1, forming a PN junction between itself and the substrate, so as to be connected with the diffusion layer 1304. The reason that the diffusion layer 1304 is formed in the frame-shape in the preceding process (FIG. 13a) is that the base width of a transistor may be adjusted in this process by adjusting the depth of the diffusion layer 1308. The cross-sectional contour of the substrate after completing this process is shown in FIG. 13c.

Figure 13D:
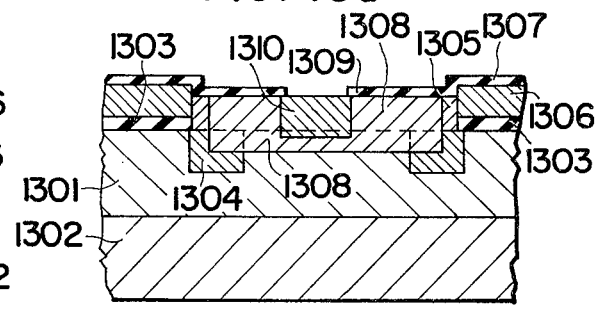

As the next step, the silicon oxide film 1309 formed in the preceding process is partly etched by a photo resist process, thus forming a third diffusion layer 1310. The diffusion layer 1310 is N$^+$ type a conductivity different from the diffusion layers 1304, 1308. This condition is shown in FIG. 13d.

Figure 13E:
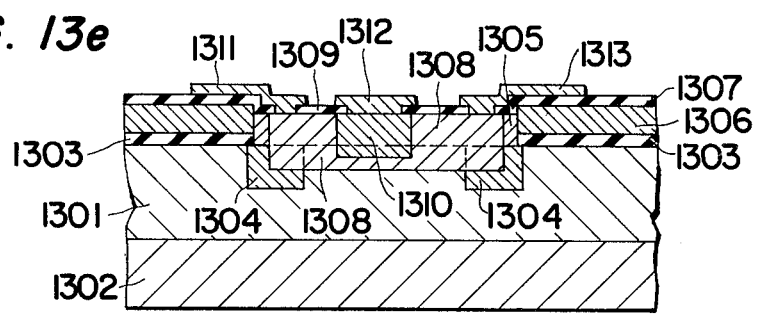

Next, the silicon oxide film 1309 is partly etached by a photo resist process, to form a metallic film over the entire surface. When this metallic film is etched by the photo resist process, it remains as shown in FIG. 13e. Herein, 1312 is the emitter electrode of a transistor and 1311, 1313 are base electrodes; if the layer 1302 is made of the same conductivity (N$^+$ type) as the layer 1301 and the electrode is taken out from one side, it becomes a collector. Further, if the layer 1302 has a conductivity (P$^+$ type) different from the layer 1301, the structure of FIG. 13e forms a thyristor and, in this case, 1311 and 1313 become gate electrodes and 1312 is a cathode electrode.

In this manner, a transistor or thyristor having a breakdown voltage exceeding 1200 V is obtained by using a silicon substrate of specific resistance of 100–50 Ω cm.

Figure 14:
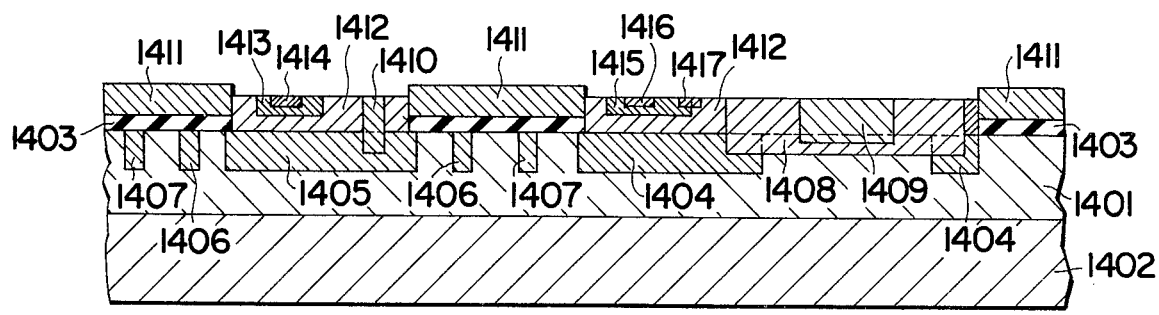
FIG. 14 is a cross-sectional view of a high voltage-proof semiconductor integrated circuit of the present invention, formed of an epitaxially grown layer provided on a semiconductor crystal substrate and circuit composing elements spanning the substrate and requiring a high degree of voltage protection.

Moreover, it is possible, by twice adding the same photo resist and diffusion processes, to form an integrated circuit containing a high breakdown voltage power transistor (or thyristor). The cross-sectional view of the wafer is shown in FIG. 14. Herein, 1413–1417 are diffusion layers, 1413 and 1415 are of the same conductivity (P type) as region 1408; and 1414, 1416, and 1417 are of the same conductivity (N$^+$ type) as the epitaxial layer 1412. By the diffusion of these elements circuit composing elements such as a diode, a transistor, a thyristor, a PNP element, a resistance, etc. are formed on the same substrate isolated from the substrate 1401.

Further, in FIG. 14, 1401 indicates N$^-$ type silicon base plate, 1402 a highly concentrated diffusion layer (P$^+$ or P$^-$ type), 1411 a polysilicon layer, 1412 a single crystal silicon layer (epitaxial layer), and 1403 silicon oxide film. Numeral 1404 denotes the framed P$^+$ type diffusion layer described earlier, 1408 a base diffusion layer (P$^+$ type) formed passing through the epitaxial layer 1412, and 1409 an emitter diffusion layer (N$^+$ type). Still further, 1405 denotes P$^+$ type diffusion layer, which composes a diode together with the substrate 1401 and also isolates a transistor consisting of N$^+$ type diffusion layer 1414 (emitter), P type diffusion layer 1413 (base), and N$^-$ type epitaxial layer 1411

(collector). A P⁺ type diffusion layer 1410 is provided for supplying a potential to a P⁺ type diffusion layer 1405. Furthermore, 1406 and 1407 denote field limiting rings explained earlier, by which the inverse voltage is better improved between the diffusion layers 1404, 1405, 1408 and the substrate 1401.

As described above, a high breakdown voltage integrated circuit device, containing a transistor, a diode, and a thyristor which are capable of withstanding a voltage over 1200 V, is obtained by using a silicon substrate of specific resistance 100–50 Ω cm.

In the present invention, only the substrate 1401 and the diffusion layers 1404, 1405, and 1408 on the surface thereof have a high inverse voltage and, therefore, the layer to which a high voltage over 1000 V is applied is restricted to the substrate 1401; accordingly, a high breakdown voltage transistor and thyristor are restricted to one type, respectively. In spite of such a restriction, it is possible to integrate considerably complicated circuits. The integrated circuit containing the high breakdown voltage transistor and the like is mainly a linear circuit and, in this case, the high breakdown voltage transistor and the like are one or two in number in most cases. As a consequence, if the circuit contains a high breakdown voltage transistor, and a high breakdown voltage transistor and a diode having the same collector region as the transistor and, if other circuit composing elements satisfactorily withstand voltages of one hundred and several tens of volts, monolithic circuit integration is possible for all cases according to the present invention.

As is clear from the above embodiments, according to the present invention, a hitherto unobtainable high breakdown voltage semiconductor device, protected against voltages above one thousand and several hundred volts, can be obtained using a conventional substrate of an elemental transistor and merely adding the formation of an epitaxial layer and a diffusion process.

It is to be noted herein that, in the above embodiments, silicon is mainly used as the semiconductor substrate, but the present invention is not limited to that material. Further, the conductivity type of the substrate is mainly N⁻ type, but the present invention is not limited thereto. Still further, diffusion layers are mainly used for the impurity introducing region provided in the substrate and epitaxial layer, but the present invention is not limited thereto and it is clear that the impurity introducing region may be formed by ion implantation.

While I have shown and described several embodiments in accordance with the present invention, it is understood that the same is not limited thereto but is susceptible of numerous changes and modifications as known to a person skilled in the art, and I therefore do not wish to be limited to the details shown and described herein but intend to cover all such changes and modifications as are obvious to one of ordinary skill in the art.

What is claimed is:

1. A high-voltage semiconductor integrated circuit device comprising:
   a semiconductor substrate of a first conductivity type;
   at least one first semiconductor region of a second conductivity type opposite said first conductivity type, provided in a portion of a first surface of said substrate, as a component of a circuit element to be provided on said substrate and to be protected against the application of a high voltage to said substrate, said first region being disposed in the form of a frame surrounding a selected portion of said first surface of said substrate;
   a first layer of insulating material disposed on the first surface of said substrate including said selected portion of said first surface of said substrate, and having a window portion exposing said first region therebeneath;
   a polycrystalline semiconductor layer provided on said first layer of insulating material;
   a single crystal semiconductor layer disposed on the exposed portion of said first surface of said substrate;
   a second semiconductor region of said second conductivity type extending through said single crystal layer from the surface thereof, reaching said substrate and overlapping said first region, said first and second regions forming components of circuit elements for which a high degree of voltage protection is to be provided;
   circuit element semiconductor regions having a prescribed degree of tolerance to the application of a low voltage thereto provided in a selected surface portion of said single crystal layer other than said second region;
   a second layer of insulating material provided on said single crystal layer and having window portions for providing electrode contacts therethrough; and
   electrodes extending through the window portions of said second layer for making electrical contact with semiconductor material exposed therebeneath.

2. A high voltage semiconductor integrated circuit device according to claim 1, further including a third semiconductor region of said first conductivity type disposed in a surface portion of said second region.

3. A high voltage semiconductor integrated circuit device according to claim 2, further including a high concentration impurity region of one of said first and second conductivity types disposed in a second surface portion of said substrate.

4. A high-voltage semiconductor integrated circuit device according to claim 1, which further comprises:
   at least one fourth semiconductor region of said second conductivity type, provided in a third portion of said first surface of said substrate, as a component of a circuit element to be provided on said substrate and to be protected against the application of a high voltage to said substrate;
   said first layer of insulating material also having a second window therethrough exposing said fourth region;
   a second single crystal semiconductor layer disposed on the exposed portion of said first surface of said substrate, through said second window;
   other circuit element semiconductor regions having a prescribed degree of tolerance to the application of a low voltage thereto provided in a selected surface portion of said second single crystal layer;
   a thrid layer of insulating material provided on said second single crystal and having a window portion therethrough for electrode contact with said other circuit regions; and
   a respective electrode in ohmic contact with each circuit element semiconductor region through a window portion of said third layer of insulating material.

5. A high-voltage semiconductor integrated circuit device according to claim 4, further including a fifth semiconductor region of said first conductivity type disposed in a surface portion of said at least one fourth region.

6. A high-voltage semiconductor integrated circuit device according to claim 5, further including a high concentration impurity region of one of said first and second conductivity types disposed in a fourth surface portion of said substrate.

* * * * *